(12) United States Patent
Fujiwara

(10) Patent No.: US 6,941,256 B1
(45) Date of Patent: Sep. 6, 2005

(54) BUS STRUCTURE, DATABASE AND METHOD OF DESIGNING INTERFACE

(75) Inventor: Makoto Fujiwara, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 643 days.

(21) Appl. No.: 09/620,474

(22) Filed: Jul. 20, 2000

(30) Foreign Application Priority Data

Jul. 30, 1999 (JP) ................................ 11-216443

(51) Int. Cl.[7] ........................ G06F 17/50; G06F 13/10; G06F 9/45; G06F 13/14
(52) U.S. Cl. ........................... 703/15; 703/13; 703/14; 703/21; 716/4; 716/5; 710/305
(58) Field of Search .............................. 703/21, 13–15; 716/4, 5; 710/305

(56) References Cited

U.S. PATENT DOCUMENTS

| | | | |
|---|---|---|---|
| 5,541,849 A | * | 7/1996 | Rostoker et al. ............... 716/18 |
| 5,907,698 A | | 5/1999 | Kucukcakar et al. |
| 6,493,351 B1 | * | 12/2002 | Shideler ....................... 370/438 |
| 6,516,379 B1 | * | 2/2003 | Deshpande et al. .......... 710/310 |

OTHER PUBLICATIONS

Mahmud, S.M. "Communication Performance in a Hierarchical Bus System". Int'l Symposium on Circuits and Systems, 1989. May 11, 1989. vol. 1, pp. 122-125.*
Mahmud, S.M. "Performance Analysis of Multilevel Bus Networks for Hierarchical Multiprocessors". IEEE Transactions on Computers. Jul. 1994. vol. 43, Issue 7, pp. 789-805.*
Chang, Y.C. et al. "Design and Performance of a Highly Pipelined Bus for Shared Memory Multiprocessor". Proceedings of the 20th EUROMICRO Conference. Sep. 8, 1994. pp. 451-456.*
Chiung-San, L. et al. "Performance Modelling and Evaluation for the XMP Shared-Bus Multiprocessor Architecture". Int'l Conf. on Parallel and Distributed Systems. Dec. 21, 1994. pp. 446-453.*
Woo-Jong, H. et al. "A Multiprocessor Server with a New Highly Pipelined Bus." Proceedings of the 10th Int'l Parallel Processing Symposium, (IPPS '96). Apr. 19, 1996, pp. 512-517.*
Jiang, H. et al. "PPMB: A Partial-Multiple-Bus Multiprocessor Architecture with Improved Cost-Effectiveness". IEEE Transactions on Computers. Mar. 1992. vol. 41, Issue 3, pp. 361-366.*
Amadori, S. et al. "Design of Complex Systems with a VHDL Based Methodology". Proc. European Design Automation Conf. 1992. pp. 658-663.*

(Continued)

*Primary Examiner*—Kevin J. Teska
*Assistant Examiner*—Ayal Sharon
(74) *Attorney, Agent, or Firm*—McDermott Will & Emery LLP

(57) ABSTRACT

With respect to each application, libraries, corresponding to operation models, for describing operations respectively attained by employing a Neumann CPU (bus structure), a Harvard CPU (bus structure) and a direction separate type CPU (bus structure) are registered. In a performance table of each library, the performance index of the library is expressed as a function of parameters of throughput, a bus width, instruction quantity and memory size. Also, a portion of the operation realized by using software and a portion realized by using hardware are registered. Through operation simulation conducted with each application successively replaced with each of the libraries, the performance of a semiconductor integrated circuit can be evaluated, so as to synthesize an optimal interface.

21 Claims, 13 Drawing Sheets

OTHER PUBLICATIONS

Hopper, A. et al. "Multiple vs. Wide Shared Bus Multiprocessors." Int'l Conf. on Computer Architecture, 1989. pp. 300-306.*

Wunder, B. et al. "A New Concept for Accurate Modeling of VLSI Interconnections and its Application for Timing Simulation", Proc. Euro. DAC. 1996. pp. 72-77.*

Wear, L. "A Comparison of Methods for Simulating Computer Bus Architectures", Proc. 13th Conf. on Winter Simulation. 1981. pp. 353-359.*

Langley, F. "Simulating Modular Microcomputers". Proc. of the 11th Annual Simulation Symposium. 1978. pp. 319-342.*

Hollingsworth, J. "The Integration of Application and System Based Metrics in a Parallel Program Performance Tool". 1991. ACM 0-89791-390-6/91/0004/0189.*

Komatsu, T. et al. "Simulator for the Evaluation of Distributed Network-System Performance". Proc. of the 1996 Winter Sim. Conf. 1996.*

* cited by examiner

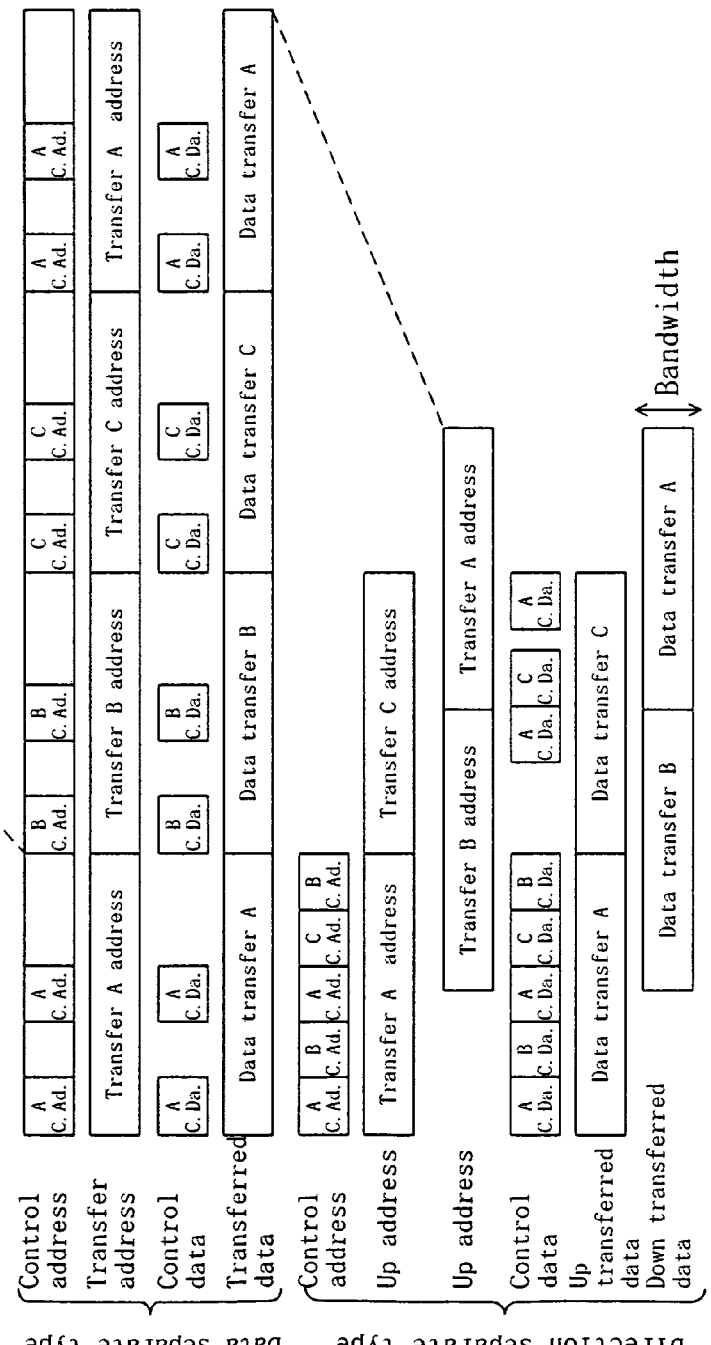

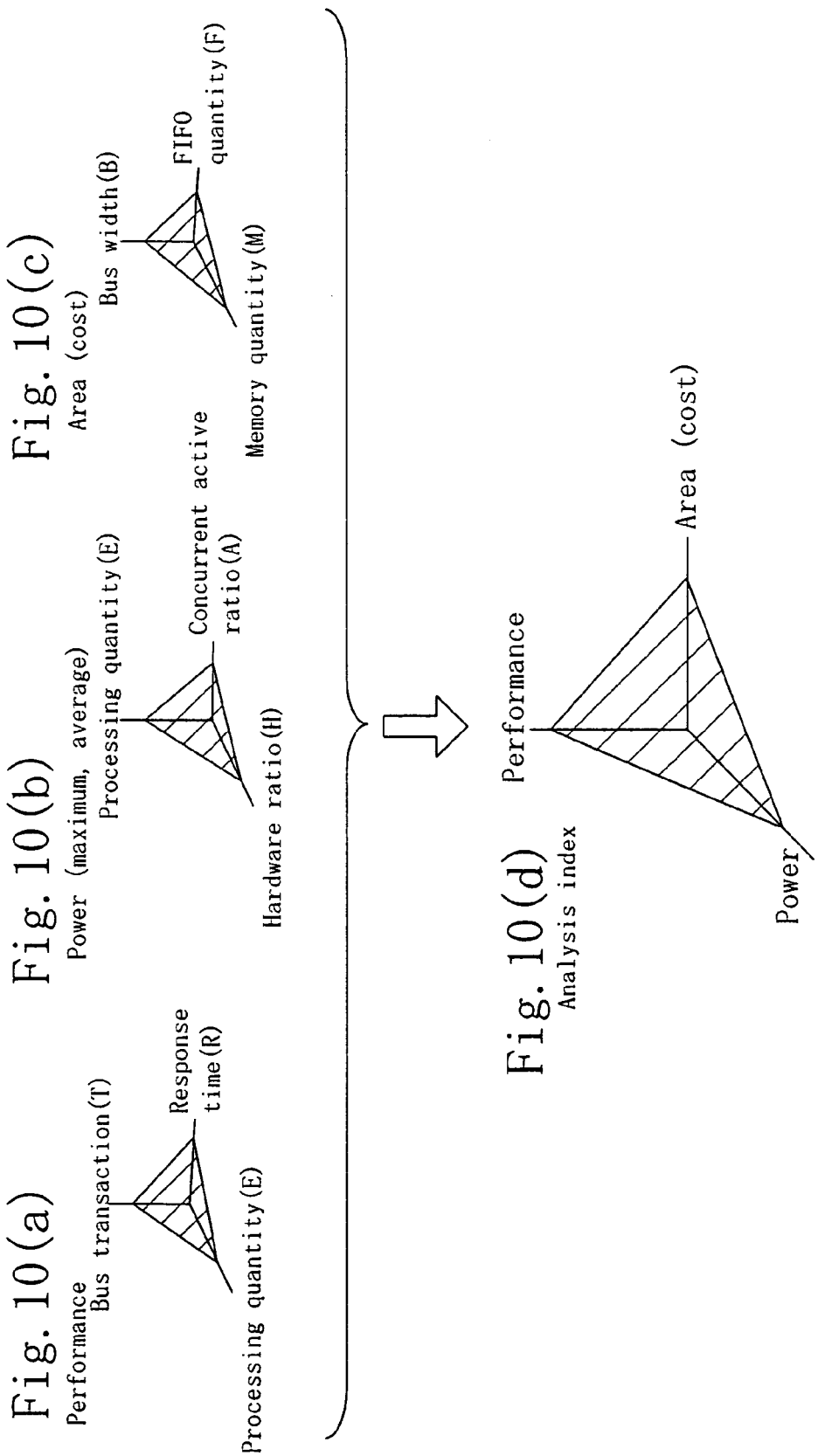

Analysis index (weighted index)

Fig. 11(a) Basis for determining performance index

Response time: R
Performance affecting coefficient of response time: lx
Bus transaction: T
Performance affecting coefficient of bus transaction: mx
Processing quantity: E
Performance affecting coefficient of processing quantity: nx
$R \cdot lx \times T \cdot mx \times E \cdot nx$ = Performance index: x
Example) lx = 1/1 sec., mx = 1/10 times, nx = 1/10 MIPS

Fig. 11(b) Basis for determining power index

Average (maximum) processing quantity: Eav (Emx)
Power affecting coefficient of processing quantity: ly
Hardware ratio: H
Power affecting coefficient of hardware ratio: my
Average (maximum) concurrent active ratio: Anv (Anx)
Power affecting coefficient of concurrent active ratio: ny
or $E_{av} \cdot ly \times H \cdot my \times A_{avny}$ = Average power index ⎫
    $E_{mx} \cdot ly \times H \cdot my \times A_{nxny}$ = Maximum power index ⎭ : y
Example) ly = 1/10 MIPS, my = 1/20%, ny = 1/25%

Fig. 11(c) Basis for determining area index

Memory quantity: M
Area affecting coefficient of memory quantity: lz
FIFO quantity: F
Area affecting coefficient of FIFO quantity: mz
Bus width: B
Area affecting coefficient of bus width: nz
$M \cdot lz \times F \cdot mz \times B \cdot nz$ = Area index: z
Example) lz = 1/1 kByte, mz = 1/128 bytes, nz = 1/16 bits

Fig. 11(d) Basis for determining analysis index

Performance index (performance)
Coefficient affecting performance index: a
Power index (power)
Coefficient affecting power index: b
Area index (area)
Coefficient affecting area index: c
ax+by+cz=Optimal index
Example) a=0.5, b=0.3, c=0.2

BUS STRUCTURE, DATABASE AND METHOD OF DESIGNING INTERFACE

BACKGROUND OF THE INVENTION

The present invention relates to a bus structure in a semiconductor integrated circuit device such as a system LSI, a method of designing an interface and a database for use in design of an interface.

A part designated as an interface for connecting a CPU of a semiconductor circuit and a circuit controlled by the CPU is conventionally significant for communication between the CPU and the circuit. The essential portion of the interface is a signal line designated as a bus, and a system for controlling data input/output, for example, controlling how right to access to the bus is acquired, is significant in sending data. In other words, the interface including the bus structure is an element having a great influence upon the ultimate performance of a device.

The conventionally known bus structures are, as is shown in FIG. 1, a Neumann architecture type bus structure used in a Neumann processor and a Harvard type bus structure used in a Harvard processor. In the Neumann architecture type bus structure, merely an address and a data are distinguished from each other, so that an address and a data can be expressed together by one line or an address and a data can be respectively expressed by two lines. Known examples of the Neumann architecture type bus structure are a multiplexer type bus structure in which an address and a data are transferred through a common bus and a demultiplexer type bus structure in which an address and a data are respectively transferred through different buses, namely, an address bus and a data bus.

A Harvard processor has a structure in which data are divided depending upon their contents into control data and data of an actually transferred file. A known Harvard type bus structure conventionally developed is a bus structure in which the address bus is further divided into an IO address bus and a memory address bus and the data bus is further divided into a control data bus and a transfer data bus (hereinafter referred to as the data separate type bus structure).

The multiplexer type bus structure is used for serially processing control and transfer of addresses and data, and the throughput attained by this structure is comparatively low but the area occupied by the bus (bandwidth) is small. The demultiplexer type bus structure is used for processing control/transfer of addresses and control/transfer of data in parallel, and since the parallel processing can be conducted, higher processing speed is attained by this structure.

Furthermore, the data separate type bus structure, that is, the conventional Harvard type bus structure, is used for processing control and transfer in parallel with respect to both addresses and data, and hence, the throughput is further higher.

In constructing a conventional large scale device such as a system LSI, however, an appropriate method of constructing the structure of an interface has not been established yet. Specifically, with respect to the bus structure alone, each of the known bus structures has both advantages and disadvantages, and a method of integrally evaluating the bus structure in relation to the operations of respective circuits has not been established yet.

Moreover, the scale of semiconductor integrated circuits is increasing. Therefore, in design of, for example, a device designated as a system LSI including a combination of plural semiconductor circuits, a flexibly usable bus structure cannot be obtained in designing an interface by employing any of the conventional bus structures alone.

SUMMARY OF THE INVENTION

An object of the invention is providing a design method for constructing an interface of a large scale semiconductor device such as a system LSI and a bus structure and a database for use in the design method.

The bus structure of this invention for connection between a control circuit and plural circuits to be controlled in a semiconductor integrated circuit, comprises an address bus divided into an upstream bus and a downstream bus; and a data bus divided into an upstream bus and a downstream bus.

According to this bus structure, restriction in concurrent instruction processing, for example, for transmitting a data to a given circuit to be controlled while transmitting another data to another circuit to be controlled, can be relaxed, resulting in improving the data processing capability of a device using the bus structure.

In the bus structure, the data bus is preferably divided with respect to each of the plural circuits to be controlled and each divided portion of the data bus is preferably further divided into an upstream bus and a downstream bus. In this manner, the restriction in concurrent instruction processing can be further relaxed.

The database of this invention for use in design of a semiconductor integrated circuit comprises a table including description of kinds of bus structures for connection between a control function part and plural applications.

Accordingly, the database is applicable to design of an interface in which restriction in concurrent instruction processing, power, area and the like varied depending upon a bus structure can be comprehensively considered.

In the database, the table preferably includes a performance table describing a performance index for evaluating performance attained by an operation model of each of the applications. In this manner, an interface can be constructed through evaluation of the entire system.

In the database, the performance table preferably includes, as the performance index, at least one of parameters of throughput, a bus width, instruction quantity and memory size. In this manner, an interface can be constructed under consideration of parameters varied depending upon the type of bus structure.

In the database, the performance table preferably includes, as the description of kinds of bus structures, description of a separate type bus structure having an address bus divided into an upstream bus and a downstream bus and a data bus divided into an upstream bus and a downstream bus. In this manner, an interface can be constructed by utilizing a novel bus structure.

The first method of this invention of designing an interface for connection between a control function part of a semiconductor integrated circuit and plural applications by using a database storing plural libraries corresponding to operation models of the plural applications, comprises a step of analyzing a number of collisions of bus transaction through an operation simulation where the applications are limitlessly operated by the control function part by successively using each of the plural libraries as the operation model of each of the plural applications.

In this method, an interface can be constructed under consideration of congestion caused in operating the applications and varied depending upon selection of the libraries.

The first method of designing an interface can further comprise a step of generating FIFOs in a number of stages according to the number of collisions of bus transaction, so that the number of collisions of bus transaction can be analyzed with the FIFOs virtually inserted between the applications. In this manner, an interface can be designed in consideration of performance attained by avoiding collisions of bus transaction.

The second method of this invention of designing an interface for connection between a control function part of a semiconductor integrated circuit and plural applications by using a database storing plural libraries corresponding to operation models of the plural applications, comprises a step of analyzing a number of concurrent instruction processing through operation simulation where the applications are limitlessly operated by the control function part by successively using each of the plural libraries as the operation model of each of the plural applications.

In this method, an interface can be designed considering how processing capability of the system attained by operating the applications is changed through selection of the libraries.

In the second method of designing an interface, a structure of a cross bar bus is preferably determined in accordance with the number of concurrent instruction processing. In this manner, an interface can be designed in consideration of performance attained by reducing the load of the control function part and dispersing a current value.

The second method of designing an interface can further comprise a step of generating a transfer operation control function part to be disposed in a bus where the number of concurrent instruction processing is larger than a predetermined value, so that the number of concurrent instruction processing can be analyzed with the transfer operation control function part disposed in the bus. In this manner, an interface can be designed in consideration of performance attained when transfer operations can be conducted in parallel.

The third method of this invention of designing an interface for connection between a control function part of a semiconductor integrated circuit and plural applications by using a database storing plural libraries corresponding to operation models of the plural applications and plural bus structures, comprises the steps of (a) setting plural main parameters for ultimately evaluating the semiconductor integrated circuit and setting plural sub-parameters affecting each of the main parameters; (b) selecting library groups where the main parameters meet target values by evaluating each of the main parameters on the basis of the sub-parameters of each of the libraries; and (c) determining an interface by selecting an optimal library group by evaluating plural main parameters determined with respect to each of the selected library groups.

In this method, as compared with a method where the performance is evaluated based on all the parameters at a time, optimal libraries can be selected more integrally, so as to ultimately determine an optimal interface.

The third method of designing an interface can further comprise, before the step (a), a step of conducting operation simulation by successively using each of the plural libraries as an operation model of each of the plural applications. Thus, an optimal interface can be more accurately determined. This method can be specifically carried out by any of the following:

For example, in the step (a), three main parameters are set and three sub-parameters are set with respect to each of the three main parameters; in the step (b), a three-dimensional coordinate system having the three sub-parameters as coordinate axes is built for selecting a library group where an area of a triangle determined according to values of the sub-parameters is smaller than a target value; and in the step (c), a three-dimensional coordinate system having the three main parameters as coordinate axes is built for determining the interface based on a library group where an area of a triangle determined according to values of the main parameters obtained from the selected library groups is minimum.

Alternatively, the method can further comprise, after the step (a) and before the step (b), a step of selecting a library group where a specific sub-parameter noticed among the plural sub-parameters meets a target value, and in the step (b), a library group where main parameters excluding a specific parameter among the plural main parameters meet target values is selected, and in the step (c), a library group where the specific main parameter is minimum is selected as the optimal library group.

Further alternatively, in the step (a), affecting coefficients of the plural sub-parameters affecting the main parameters are respectively set; in the step (b), a library group where the main parameters meet target values is selected on the basis of the affecting coefficients and values of the sub-parameters; and in the step (b), plural main parameters obtained from the selected library groups are weighted before selecting the library group where the main parameters meet the target values.

The fourth method of this invention of designing an interface for connection between a control function part of a semiconductor integrated circuit and plural applications by using a database storing plural libraries corresponding to operation models of the plural applications and plural bus structures, comprises the steps of (a) successively selecting each of the plural libraries as the operation model of each of the plural applications; (b) operating the plural applications by the control function part, whereby analyzing performances of the control function part, an interface and the applications attained by using each of the libraries; (c) repeatedly conducting the steps (a) and (b), whereby determining an interface by selecting an optimal library group on the basis of results of the analysis; and (d) synthesizing an optimal interface on the basis of the determined parameters.

In this method, an optimal interface can be synthesized based on performance evaluation of the entire system attained by operating the respective applications. Thus, a basic interface design method can be established.

In the fourth method of designing an interface, in the step (b), a number of collisions of bus transaction occurring by limitlessly operating the applications by the control function part is preferably analyzed with respect to each of the libraries, and in the step (d), FIFOs in a number of stages according to the number of collisions of bus transaction are preferably inserted between the applications.

In the fourth method of designing an interface, in the step (b), a number of concurrent instruction processing occurring by limitlessly operating the applications by the control function part is preferably analyzed with respect to each of the libraries, and in the step (d), a cross bar bus is preferably disposed in a bus where the number of concurrent instruction processing is larger than a predetermined value.

BRIEF DESCRIPTION OF THE DRAWINGS

FIGS. 3(a), 3(b), 3(c) and 3(d) are diagrams for showing processing of addresses and data on time base in a Neumann multiplexer type bus structure, a Neumann demultiplexer type bus structure, a Harvard data separate type bus structure and the direction separate type bus structure of Embodiment 1;

FIGS. 10(a), 10(b), 10(c) and 10(d) are diagrams for showing procedures in selecting a library with a minimum cross area from libraries whose parameters meet target values;

FIGS. 11(a), 11(b), 11(c) and 11(d) are diagrams for showing procedures in weighting a performance index, an average power index (or a maximum power index) and an area index, summing up the indexes to obtain a sum as an optimal index and selecting a library with a smallest optimal index;

DETAILED DESCRIPTION OF THE INVENTION

Embodiment 1

Figure 1:
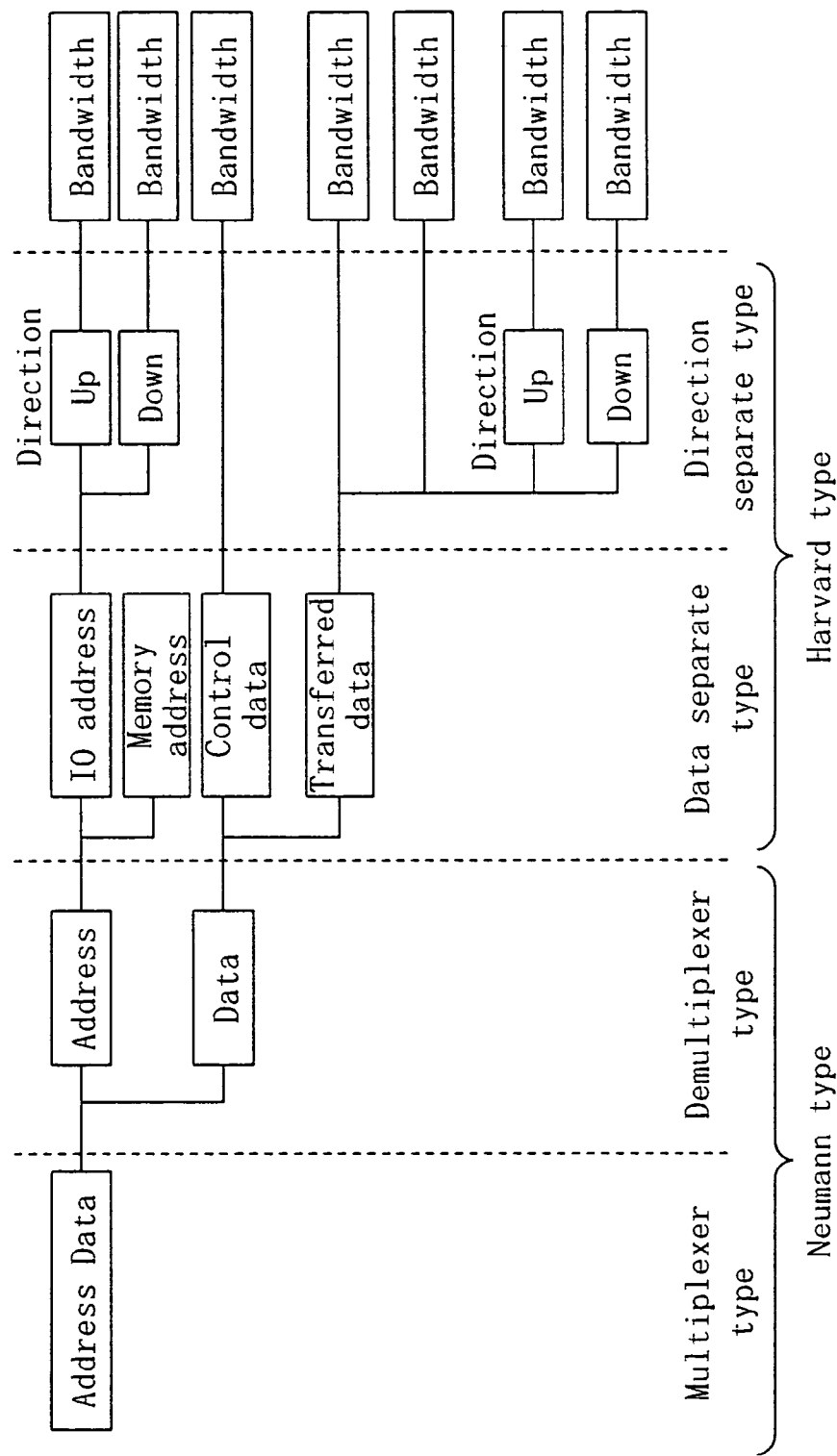
FIG. 1 is a block diagram for schematically showing structural differences among conventional Neumann architecture type bus structures, a conventional Harvard type bus structure and a novel Harvard type bus structure according to Embodiment 1 of the invention.

FIG. 1 is a block diagram for schematically showing structural differences among conventional Neumann architecture type bus structures, a conventional Harvard type bus structure and a novel Harvard type bus structure according to this embodiment.

The Harvard type bus structure of this embodiment may be designated as a "direction separate type bus structure", which is obtained by further separating transferred data to be processed in the data separate type bus structure. In the direction separate type bus structure, assuming that target resources (circuits to be controlled) are placed around a processor (control circuit) at the center, the directions of sending transferred data are divided into an "up" direction and a "down" direction, and also the transferred data sent to the circuits to be controlled may be divided into a memory data and an IO data. Herein, a control data is a data on control of, for example, recognition and response, and a transferred data is a batch of data such as an image file data.

Figure 2A:
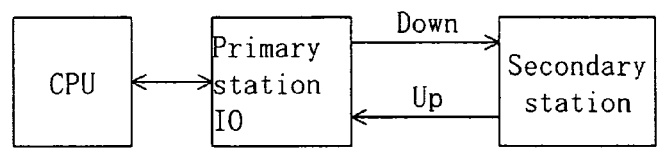
FIGS. 2(a), 2(b) and 2(c) are diagrams for showing examples of a conventional bus structure and direction separate type bus structures (employed when a tertiary station is provided and no tertiary station is provided) of Embodiment 1, respectively.

FIG. 2(a) is a diagram of a conventional bus structure. As is shown in FIG. 2(a), merely one bus is provided between a CPU and a target resource (i.e., a primary station IO in this drawing) in the conventional bus structure.

Figure 2B:
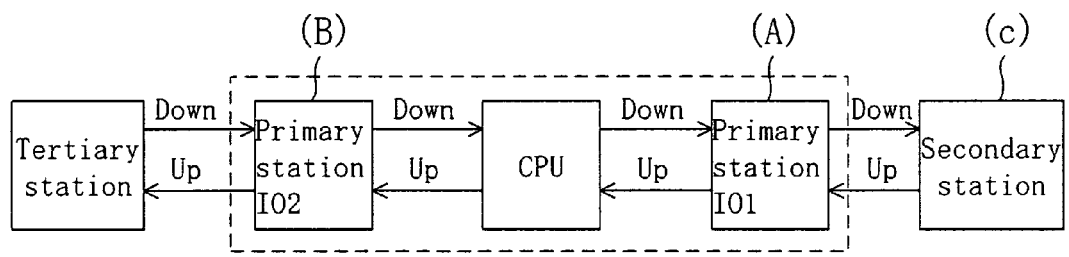
Figure 2C:
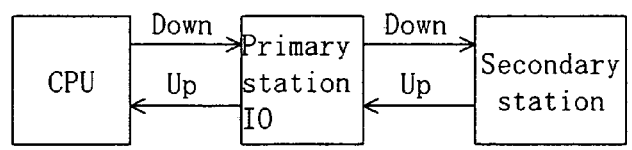

In contrast, in the direction separate bus type structure of this embodiment, communication between a processor (CPU) and a primary station is carried out separately between an upstream bus and a downstream bus as is shown in FIGS. 2(b) and 2(c). FIG. 2(b) is a diagram for showing a direction separate type bus structure employed when secondary and tertiary stations communicate with the CPU respectively through primary stations, and FIG. 2(c) is a diagram for showing a direction separate type bus structure employed when the tertiary station of FIG. 2(b) is not present.

FIGS. 3(a) through 3(d) are diagrams for showing processing of addresses and data on time base in the Neumann multiplexer type bus structure, the Neumann demultiplexer type bus structure, the Harvard data separate type bus structure and the direction separate type bus structure, respectively.

In the multiplexer type bus structure, as is shown in FIG. 3(a), addresses and data are serially processed along one line in a sense. For example, when a given command is to be generated for a target resource A, a control address of the target resource A is specified, a control data for the target resource A is sent, an address for transferring a data to the target resource A is sent, and then a transferred data is sent to the target resource A. Also in generating a command for a target resource B, similar procedures are serially carried out.

In the demultiplexer type bus structure, as is shown in FIG. 3(b), addresses and data are processed in parallel. For example, when a given command is to be generated for a target resource A, a control data for the target resource A is sent while specifying a control address of the target resource A, and a transferred data is sent to the target resource A while sending an address for transferring the data to the target resource A. Also in generating a command for a target resource B, similar procedures are carried out in parallel.

In the data separate type bus structure, as is shown in FIG. 3(c), a control address, a transfer address, a control data and a transferred data are processed in parallel. For example, when a given command is to be generated for a target resource A, specification of a control address of the target resource A, transmission of a control data to the target resource A, transmission of an address for sending a data to the target resource A and transmission of the transferred data to the target resource A are carried out in parallel. Also in generating a command for a target resource B, similar procedures are carried out in parallel.

In the direction separate type bus structure, as is shown in FIG. 3(d), not only a control address, a transfer address, a control data and a transferred data are processed in parallel but also transmission of the addresses and the data is carried out in parallel separately between the up direction and the down direction. For example, when given commands are to be generated for target resources A, B and C, an up address or a down address is specified in specifying control addresses of the target resources A, B and C. When the up address is specified, a transfer address and a transferred data in the up direction (for example, for the target resources A and C) are sent through the upstream bus, and when the down address is specified, a transfer address and a transferred data in the down direction (for example, for the target resources B and A) are sent through the downstream bus. In other words, transmission of transfer addresses and transferred data can be carried out independently of specification of control addresses and transmission of control data.

For example, it is assumed, in the bus structure of FIG. 2(b), that a primary station IO 1 is a target resource A, a primary station IO 2 is a target resource B and a secondary station is a target resource C. In this case, in specifying an address of the target resource A (i.e., the primary station IO 1), the specified address of the target resource A is not input to the target resource B (i.e., the primary station IO 2), and hence, while a transferred data is being sent to the target resource A with the transfer address of the target resource A specified, another transferred data can be sent to the target resource B with a transfer address of the target resource B specified. Furthermore, a data can be output (sent in the down direction) as soon as the data is input (sent in the up direction).

Figure 4:
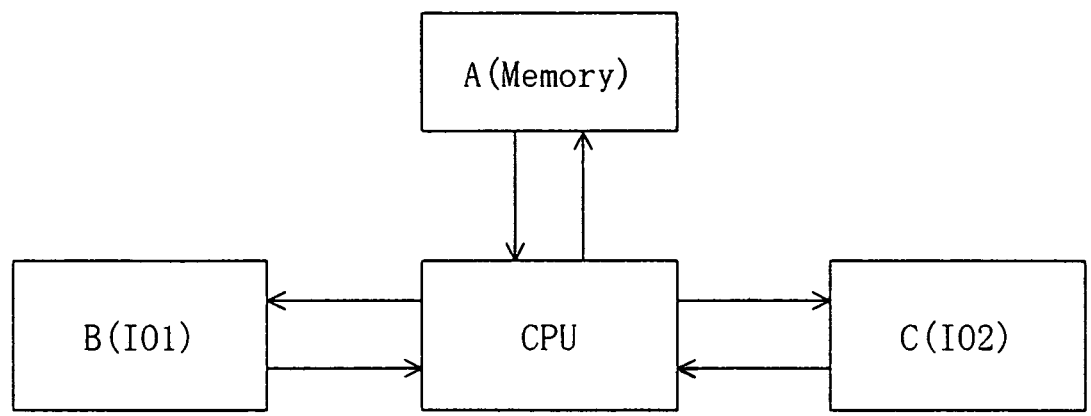
FIG. 4 is a block diagram of a resource separate type bus structure of Embodiment 1 in which a target resource A is a memory and target resources B and C are IOs.

FIG. 4 is a block diagram for showing a resource separate type bus structure employed when a target resource A is a memory and target resources B and C are IOs. While the CPU is receiving a data input from the target resource C (i.e., the IO 2) and storing the data in the target resource A (i.e., the memory), the CPU can send a data to the target resource B (i.e., the IO 1) at the same time.

Accordingly, in the conventional data separate type bus structure, time required for data transfer is, as is shown in FIG. 3(c), obtained by serially summing up times required for data transfer A, data transfer B, data transfer C and data transfer A (and the same can be said with respect to time required for data transfer A, B and C and address transfer A). In contrast, in the direction separate type bus structure of this embodiment, time required for data transfer can be shortened as shown in FIG. 3(d). This is because, by separately providing the upstream bus and the downstream bus, the transmission of transfer addresses and transferred data in the up direction to the target resources A and C and the transmission of transfer addresses and transferred data in the down direction to the target resources B and A can be simultaneously carried out.

Embodiment 2

A design method for an IF (interface) including a bus structure according to Embodiment 2 of the invention will now be described. Procedures for designing an optimal IF are as follows:

Data to be Prepared

First, data necessary for performance analysis (library models) will be described. It is necessary to create an operation model with respect to each unit application. As an exemplified method of creating an operation model, an operation model is basically created by using software, and it is determined, with respect to each operation model, what percentages are created by using hardware. A unit application is defined by the input/output relationship of one application and is not defined in the range. Examples of the unit application are a transfer operation of print data by using IrDA, transfer of the positional data of a mouse by using a USB, and compression and decompression of still image data by using JPEG. In using an application for data transfer using infrared communication designated as "IrDA", data for printing should be previously processed on a computer side. For example, the data is compressed by JPEG for compressing a still image, the format is converted for expressing the data as infrared, and then the data is transferred by the infrared communication. In this case, a unit application herein corresponds to processing prescribed by the input and the output of the application designated as IrDA excluding the processing prior to the infrared communication (IrDA).

The processing time is varied depending upon whether an operation model is created by using hardware or software. In this embodiment, it is determined which part of an operation model is created by using hardware or software on the basis of a portion where respective layers are divided more or less definitely in expression of one protocol.

Figures 5A, 5B:
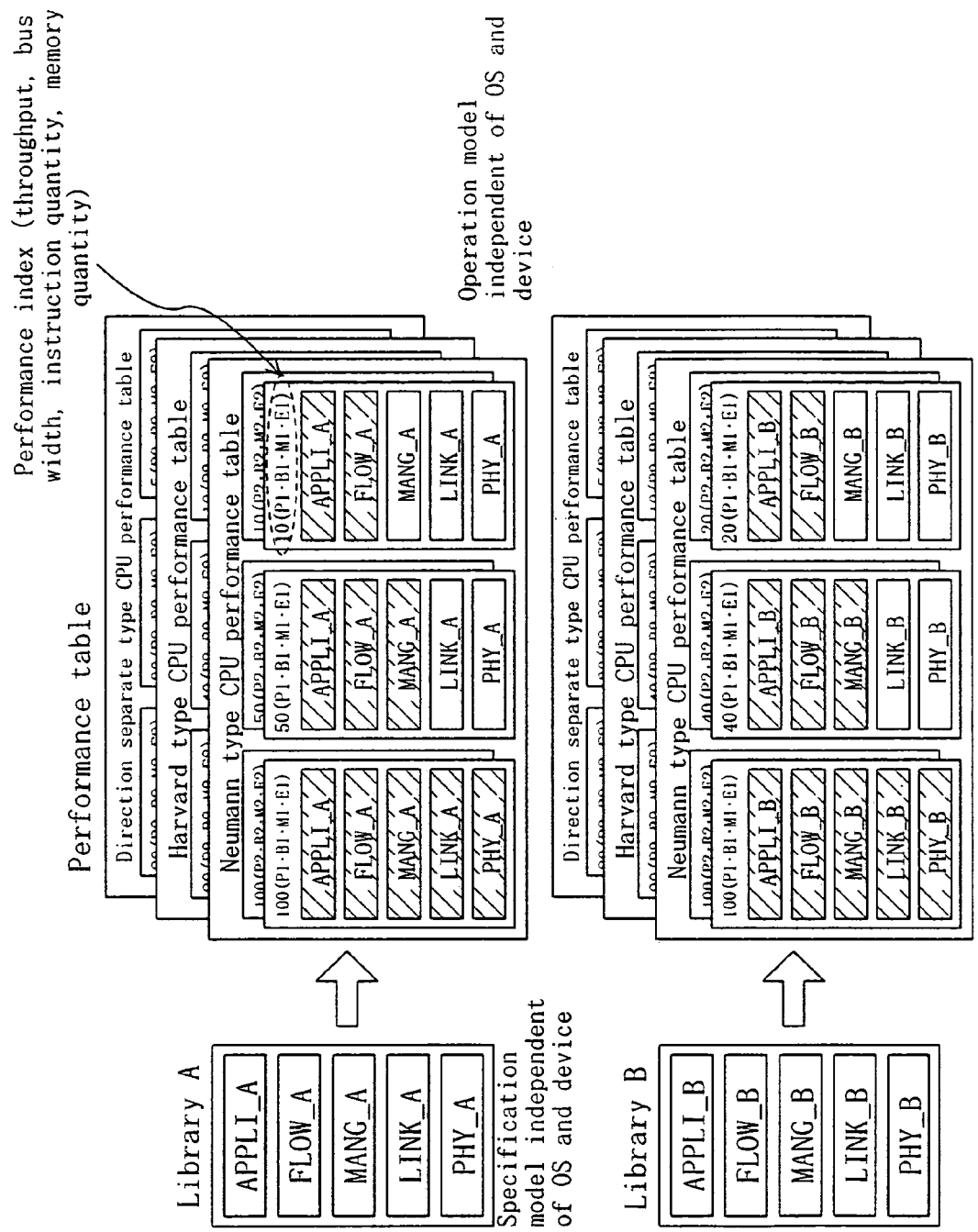
FIGS. 5(a) and 5(b) are diagrams for showing examples of a library and a performance table of unit applications A and B stored in a design database according to Embodiment 2.

FIGS. 5(a) and 5(b) are diagrams for showing examples of a library and a performance table of unit applications A and B stored in a design database. When it is assumed, for example, that there are libraries A and B at specification level for the applications A and B, respectively, performance tables corresponding to operation models describing operations attained by employing, as the CPU (bus structure), the Neumann architecture type CPU (bus structure), the conventional Harvard type CPU (bus structure) and the direction separate type CPU (bus structure) are registered with respect to each of the applications A and B as shown in FIGS. 5(a) and 5(b). In each performance table of each library, the performance index of the library is expressed as a function of parameters of throughput (P), a bus width (B), instruction quantity (M) and memory size (E).

In FIGS. 5(a) and 5(b), hatched portions in the description of the operations of the libraries are realized by using software and portions without hatching are realized by using hardware. When it is assumed, in the application A, that the performance index is 100 when all the functions are realized by using software, the performance index is, for example, 50 if 40% of the functions are realized by using hardware and remaining 60% of the functions are realized by using software, and the performance index is 10 if 60% of the functions are realized by using hardware. The performance tables are thus prepared so as to show the performance indexes attained by replacing what percentage of software with hardware.

In the functions of the operation model, "FLOW" corresponds to a layer for describing a flow of procedures, such as, for example, when processes a and b are to be conducted, "the process a is followed by the process b". Also, "MANG" corresponds to a layer for describing a method of managing communication between applications, such as, for example, when different file transfer applications are connected to each other, multiplexers of data exchange necessary for the applications. Furthermore, "LINK" corresponds to a layer for defining procedures in linkage, for example, for allowing one information data to be recognized as a data surrounded by a series of data such as a sync bit, a control data, a MAC data and an ending. Moreover, "PHY" corresponds to a layer for defining an actual coding method, for example, when "1" is to be expressed, for determining whether or not "1" is expressed at a given pulse width or at the center of a given pulse width. Also, "CAL" corresponds to a layer for indicating, for example, in arithmetic processing, whether the calculation processing (such as multiplication) is carried out by using hardware or software.

Furthermore, it is necessary to take it consideration that when processing is carried out by using software, high performance is required but the performance may be lower by utilizing hardware to some extent. Although the performance tables as shown in FIGS. 5(a) and 5(b) are prepared with respect to a large number of applications, FIGS. 5(a) and 5(b) merely exemplify the applications A and B.

Operation Simulation

Figure 6:
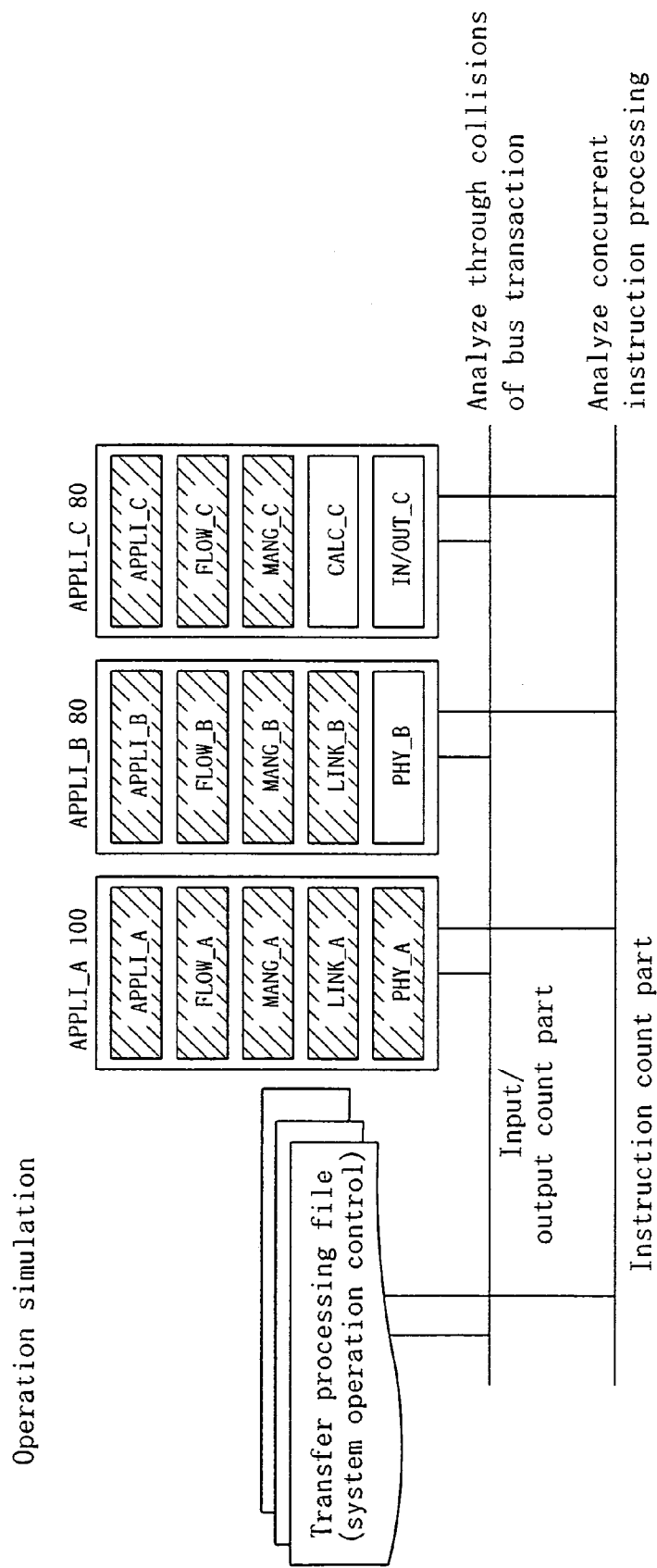
FIG. 6 is a block diagram for showing an example of a method of conducting operation simulation by using plural applications in Embodiment 2.

FIG. 6 is a block diagram for showing an example of a method of conducting operation simulation by using plural applications. Herein, it is assumed that a library realized by using software by 100% is used for an application A, that a library realized by using hardware by 20% is used for an application B and that a library realized by using hardware by 40% is used for an application C, so as to analyze the performance in transfer processing of these three applications.

At this point, in the connection shown in FIG. 6, a portion for counting inputs and outputs (input/output count part) and a portion for counting instruction processing (instruction count part) are described in the operation analysis simulation. For example, when the applications A, B and C are connected to a transfer processing ile (system operation control), the input/output count part counts the number of collisions of input/output between the processor and respective circuits (collisions of bus transaction) occurring if the transfer processing is carried out without any management. In other words, the input/output count part measures the congestion of buses. Also, it counts the number of instruction processing including the collisions.

Figure 7:
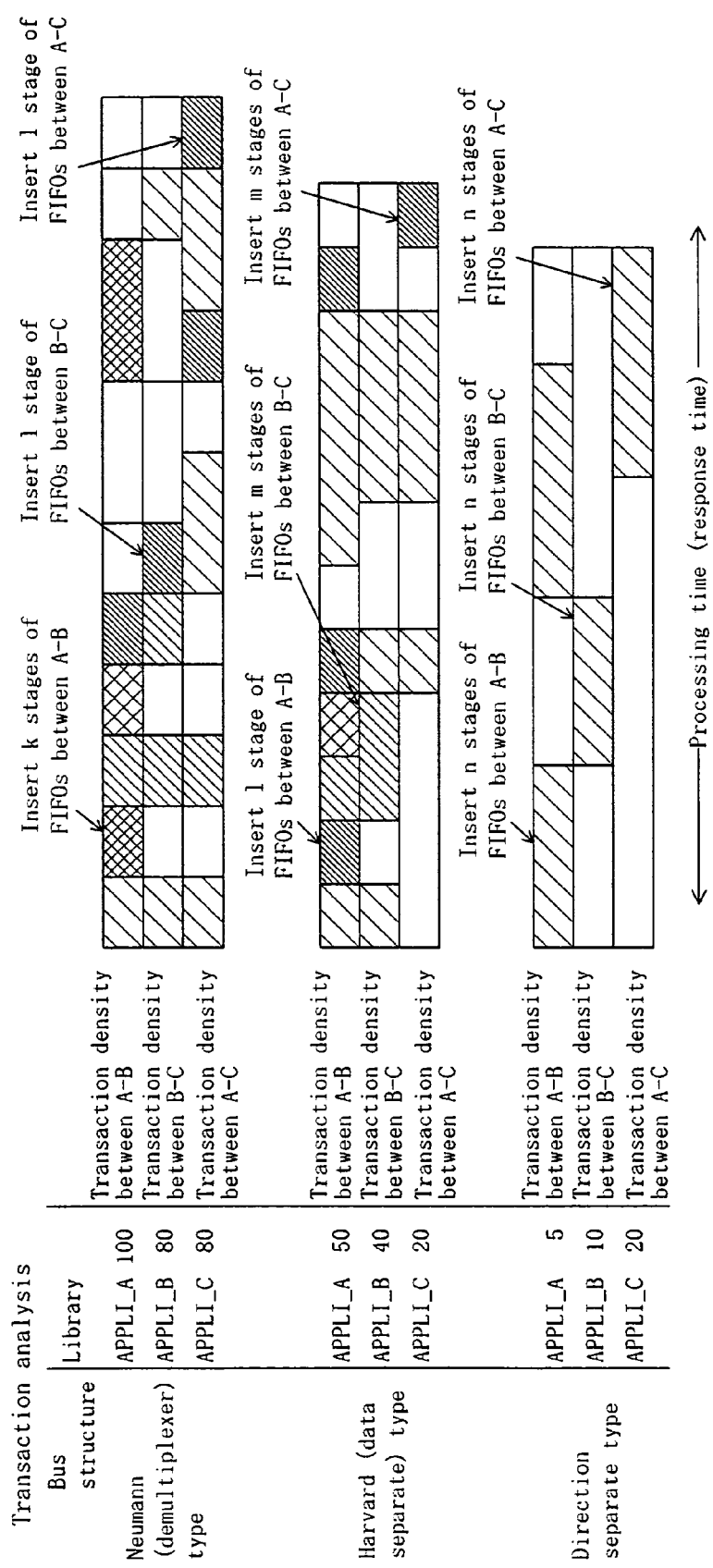
FIG. 7 is a diagram for showing a method of displaying transaction analysis, that is, one performance analysis of Embodiment 2.

FIG. 7 is a diagram for showing a method of displaying transaction analysis in this performance analysis. As is shown in FIG. 7, with respect to each of the applications A, B and C and with respect to each of the cases of employing the library of the Neumann architecture type bus structure (demultiplexer type), the library of the conventional Harvard type bus structure (data separate type) and the library of the direction separate type bus structure, the transaction densities between the applications A and B, the applications B and C and the applications A and C measured by the input/output count part are arranged on processing time base. In FIG. 7, a higher hatching density indicates a larger number of collisions. In employing the Neumann architecture type bus structure, the number of collisions is unavoidably large when parallel processing is carried out. In contrast, in employing the direction separate type bus structure, the number of collisions is comparatively small because parallel processing can be easily carried out in this structure. Then, a FIFO is inserted into a portion where a large number of collisions occur. For example, in employing the Neumann architecture type bus structure, k stages (for example, ten stages) of FIFOs are inserted between the applications A and B, 1 stages (for example, eight stages) of FIFOs are inserted between the applications B and C, and 1 stages of FIFOs are inserted between the applications A and C. Alternatively, in employing the conventional Harvard (data separate type) bus structure, 1 stages of FIFOs are inserted between the applications A and B, m stages (for example, six stages) of FIFOs are inserted between the applications B and C, and m stages of FIFOs are inserted between the applications A and C. Furthermore, in employing the direction separate type bus structure, n stages (for example, four stages) of FIFOs are inserted between the applications A and B, n stages of FIFOs are inserted between the applications B and C and n stages of FIFOs are inserted between the applications A and C. It is necessary to store information in FIFOs during the processing of the CPU, and the number of stages of FIFOs to be inserted is analyzed in accordance with the congestion of the bus. It goes without saying that the number of stages of FIFOs to be inserted is smaller as the number of collisions of the bus transaction is smaller. In this manner, in accordance with each bus structure, namely, the structure of each bus connected to the CPU, the number of stages of FIFOs to be inserted is determined.

Figure 8:
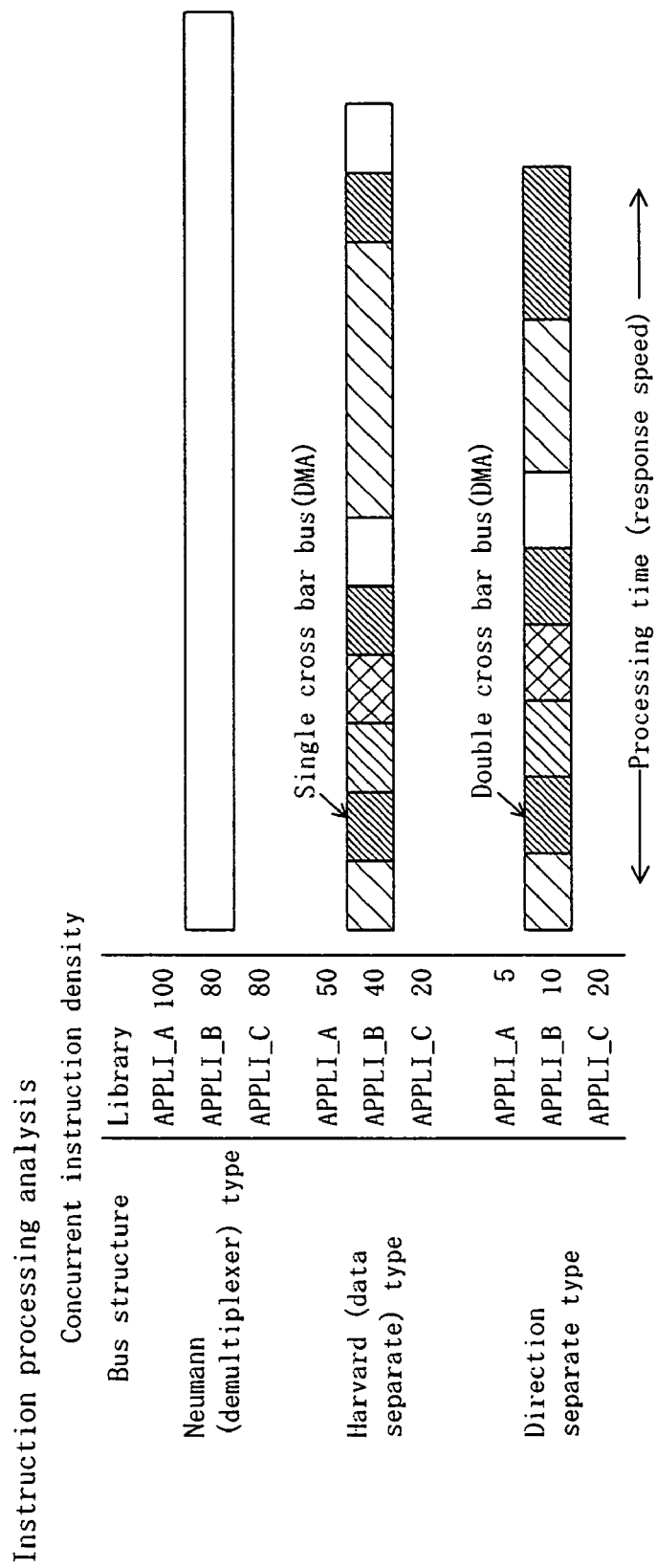
FIG. 8 is a diagram for showing a method of displaying instruction processing analysis, that is, another performance analysis of Embodiment 2.

FIG. 8 is a diagram for showing a method of displaying the instruction processing analysis in this performance analysis. As is shown in FIG. 8, with respect to each of the applications A, B and C and with respect to each of the cases of employing the library of the Neumann (demultiplexer type) bus structure, the library of the conventional Harvard (data separate type) bus structure and the library of the direction separate type bus structure, concurrent instruction densities between the applications A and B, the applications B and C and the applications A and C measured by the instruction count part are arranged on processing time base. In FIG. 8, a higher hatching density indicates a larger number of concurrent instructions, namely, higher throughput of the entire system. In employing the Neumann architecture type bus structure, the number of concurrent instructions is small. In contrast, in employing the direction separate type bus structure, the number of concurrent instructions is comparatively large. When the number of concurrent instructions is larger, the processing time is shorter and the response speed is higher, but on the contrary, there arises a problem that the load of the CPU is larger and an instant current value is larger.

Figure 9:
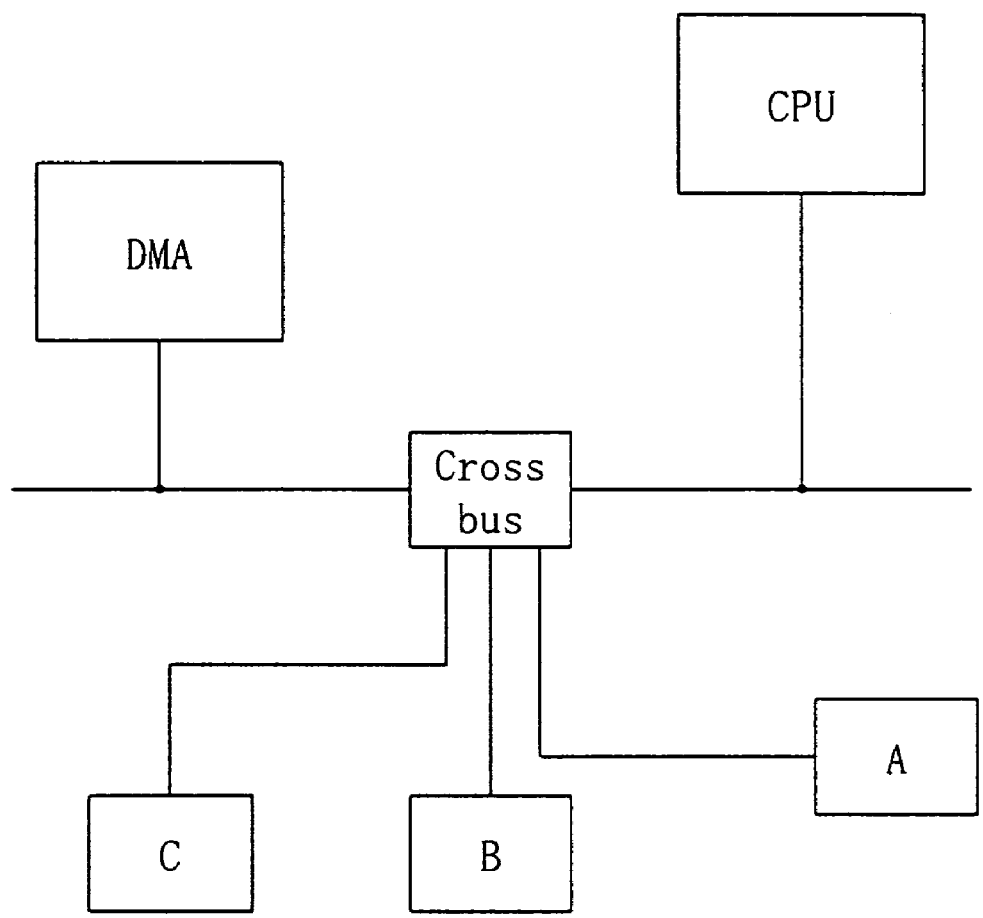
FIG. 9 is a diagram for showing part of a bus structure resulting from providing a cross bar bus in a portion where a large number of concurrent instructions occur in Embodiment 2.

FIGS. 9(a) and 9(b) are diagrams for showing part of a bus structure in which a cross bar bus is provided in a portion where a large number of concurrent instructions occur. As is shown in FIG. 9, when the CPU has a reserve in its function, a portion not generally used is provided with a transfer function of the application B and the CPU controls switching of the cross bar bus. Alternatively, when the CPU does not have a reserve or the like, a DMA is provided. The DMA (direct memory access) has a transfer function to allow direct data transfer between an input/output controller and a main storage not through the CPU. In other words, the CPU does not control all the processing but a cross bar bus having a switching function is provided and the function of the DMA is utilized, and the cross bar bus is switched so that, for example, the application A can be processed by the CPU and the application B can be processed by the DMA. In this manner, the load of the CPU can be reduced and a current value can be dispersed. This newly added element may be a CPU instead of the DMA as far as it has a transfer function. In this case, attention should be paid to a portion where the largest number of concurrent instructions occur, so as to determine whether no cross bar bus is provided, a single cross bar bus is provided or a double cross bar bus is provided on the basis of the maximum number of concurrent instructions occurring in employing a given type of CPU.

Analysis Index

Next, a method of selecting the optimal performance among the performances obtained as a result of the aforementioned analyses will be described. The most significant parameters for evaluating a system are herein designated as main parameters, and it is herein assumed that the main parameters are performance, power and area. In consideration of three sub-parameters affecting each of these main parameters as a whole, a library group with the main parameters respectively falling within target ranges is first selected. Then, on the basis of the values of the main parameters of the selected library group, an optimal library group is comprehensively selected.

The optimal library group is specifically selected by any of the following methods:

1. Method For Selecting Libraries with Minimum Cross Area:

FIGS. 10(a) through 10(d) are diagrams for showing procedures in a method for selecting a library with a minimum cross area among libraries having satisfactory parameters.

First, as is shown in FIG. 10(a), the number of collisions of bus transaction, the processing quantity and the response time are set as the three sub-parameters affecting the main parameter, "performance", and a three-dimensional coordinate system having these sub-parameters as the coordinate axes is built. The values of the three sub-parameters are obtained on the basis of the analysis resulting from the operation simulation conducted by using the libraries corresponding to the operation models of the respective applications. The values are uniquely defined depending upon, for example, whether the Neumann architecture type bus structure, the conventional Harvard type bus structure or the direction separate type bus structure is employed for each of the unit applications A, B and C connected to the CPU, and what percentages of the operation of each application is realized by using hardware. For example, on the basis of the analysis results shown in FIGS. 7 and 8, the number of collisions of bus transaction and the processing time are obtained. At this point, the worst value or the average value of the number of collisions of transaction between respective IOs, the average value in the entire system or the average value in a given section can be determined as transaction T. The execution (simulation) time required in conducting the data analysis as shown in FIGS. 7 and 8 is determined as response time R. The execution processing quantity (sum) required in conducting the analysis of FIGS. 7 and 8 is determined as processing quantity E.

The performance of a system LSI is higher as the bus transaction T is smaller, the processing quantity E is smaller and the response time R is shorter. Therefore, the main parameter, performance, is better as the cross area in the three-dimensional coordinate system is smaller. Accordingly, a library group in which a cross area between the coordinate axes of the coordinate system and a plane formed by linking respective values (values of the sub-parameters) on the coordinate axes is smaller than a given target value is selected. This cross area may be relatively regarded as the value of "performance".

Also, as is shown in FIG. 10(b), the processing quantity E, a hardware ratio H and a concurrent active density A are determined as the three sub-parameters affecting the main parameter, "power", and a three-dimensional coordinate system having the three sub-parameters as the coordinate axes is built. The hardware ratio H corresponds to the percentages of hardware in each operation model shown in FIG. 6. The concurrent active density A corresponds to the ratio of concurrently activated buses obtained in the analyses of FIGS. 7 and 8. In this case, the power can be smaller as the processing quantity E is smaller, the hardware ratio H is smaller and the concurrent active density A is smaller. Therefore, the main parameter of power is better as the cross area in the three-dimensional coordinate system is smaller. Accordingly, a library group in which a cross area between the coordinate axes of the coordinate system and a plane formed by linking respective points (values of the sub-parameters) on the coordinate axes is smaller than a given target value is selected. This cross area may be relatively regarded as the value of "power". In this case, evaluation can be made based on either the peak value of power or the average value of power.

Furthermore, as is shown in FIG. 10(c), a necessary bus width B, necessary memory size M and the FIFO quantity F of FIFOs to be inserted are determined as the three sub-parameters affecting the main parameter, "area (cost)", and a three-dimensional coordinate system having the sub-parameters as the coordinate axes is built. The bus width B corresponds to the total width of buses in the bus structure of each operation model of FIG. 6. The memory size M corresponds to memory size used in each operation model of FIG. 6. The FIFO quantity F corresponds to the sum of stages of FIFOs determined as a result of the analyses of FIGS. 7 and 8. In this case, the main parameter of area is better as the bus width B is smaller, the memory size M is smaller and the FIFO quantity F is smaller. Accordingly, a library group in which a cross area between the coordinate axes of the coordinate system and a plane formed by linking respective points (values of the sub-parameters) on the coordinate axes is smaller than a given target value is selected. This cross area may be relatively regarded as the value of "area".

Then, as is shown in FIG. 10(d), a three-dimensional coordinate system having the main parameters, namely, performance, power and area, as the coordinate axes is built. Thereafter, a library group in which a cross area (area of a triangle) between the coordinate axes and a plane formed by linking values of the main parameters determined based on the library groups selected through the procedures of FIGS. 10(a) through 10(c), namely, the values of performance, power and area (the cross areas of FIGS. 10(a) through 10(c)), is minimum is selected. Then, an interface determined based on the selected library group is determined as the optimal interface.

2. Method for Selecting Libraries with Laying Stress on Specific Parameters:

For example, on the basis of the analysis results shown in FIGS. 7 and 8, a library with a sub-parameter of bus transaction smaller than a predetermined value is selected among libraries having satisfactory response time as another sub-parameter, a library with a sub-parameter of processing quantity smaller than a predetermined value is selected among libraries having satisfactory response time as another sub-parameter, a library with a sub-parameter of bus width smaller than a predetermined value is selected among libraries having satisfactory memory size as another sub-parameter, and a library with a sub-parameter of bus width smaller than a predetermined value is selected among libraries having satisfactory FIFO quantity as another sub-parameter.

Then, among the libraries selected as described above, optimal libraries are comprehensively selected on the basis of the following points. The optimal libraries are variously selected depending upon the kind or the like of a circuit device to be designed as follows:

First, from the selected libraries, libraries whose main parameters of performance and power meet target minimum performance and target maximum power are selected. Then, among the thus selected libraries, a library group whose main parameter of area is smallest is selected as the optimal library group.

Secondly, from the selected libraries, libraries whose main parameters of performance and power meet target minimum performance and target maximum power are selected. Then, among the thus selected libraries, a library group whose main parameter of average power is smallest is selected as the optimal library group.

Thirdly, from the selected libraries, libraries whose main parameters of area and maximum power meet target maximum area and target maximum power are selected. Then, among the thus selected libraries, a library group whose main parameter of performance is smallest is selected as the optimal library group.

Fourthly, from the selected libraries, libraries whose main parameter of area and maximum power meet target maximum area and target maximum power are selected. Then, among the thus selected libraries, a library group whose main parameter of average power is smallest is selected as the optimal library group.

3. Method for Selecting Libraries by Using Weighted Indexes:

In this method, as is shown in FIGS. 11(a) through 11(d), a performance index x of the main parameter of performance, an average power index yav (or a maximum power index ymx) of the main parameter of power and an area index z of the main parameter of area are respectively weighted by a, b and c, and the resultants are summed up to obtain a total value as an optimal index. Then, a library having a smallest optimal index is selected.

In this case, the performance index x is calculated as follows: As is shown in FIG. 11(a), the response time R and its performance affecting coefficient $l_x$, the bus transaction T and its performance affecting coefficient $m_x$, and the processing quantity E and its performance affecting coefficient $n_x$ are respectively calculated. Then, the performance index x is calculated by the following formula:

Performance index $x=Rl_x \times Tm_x \times En_x$

The performance affecting coefficient $l_x$ of the response time is "1" when the response time is, for example, 1 second. In other words, when the response time is 3 seconds, the performance affecting coefficient $l_x$ of the response time is "3". The performance affecting coefficient $m_x$ of the bus transaction is "1" when 10 collisions occur. In other words, when 20 collisions occur, the performance affecting coefficient $m_x$ of the bus transaction is "2". The performance affecting coefficient $n_x$ of the processing quantity is "1" when the processing quantity is 10 MIPS (wherein 1 MIPS corresponds to million instructions). In other words, when the processing quantity is 50 MIPS, the performance affecting coefficient $n_x$ of the processing quantity is "5".

The power index y is calculated as follows: As is shown in FIG. 11(b), average processing quantity Eav (or maximum processing quantity Emx) and its power affecting coefficient $l_y$, the hardware ratio H and its power affecting coefficient $m_y$, and average concurrent active ratio Aav (or a maximum concurrent active ratio Amx) and its power affecting coefficient $n_y$ are respectively calculated. Then, the power index y is calculated by the following formula:

Power index $y=Eavl_y \times Hm_y \times Aavn_y$ or $=Emxl_y \times Hm_y \times Amxn_y$ The power affecting coefficient $l_y$ of the average processing quantity (or the maximum processing quantity) is "1" when the processing quantity is, for example, 10 MIPS. The power affecting coefficient my of the hardware ratio is "1" when the hardware ratio is 20%. In other words, when the hardware ratio is 40%, the power affecting coefficient $m_y$ of the hardware ratio is "2". The power affecting coefficient $n_y$ of the average concurrent active ratio (or the maximum concurrent active ratio) is "1", when the concurrent active ratio is 25%. In other words, when the concurrent active ratio is 10%, the power affecting coefficient $n_y$ of the average concurrent active ratio is "0.5".

The area index z is calculated as follows: As is shown in FIG. 11(c), the memory size M and its area affecting coefficient $l_z$, the FIFO quantity F and its area affecting coefficient $m_z$, and the bus width B and its area affecting coefficient $n_z$ are respectively calculated. Then, the area index z is calculated by the following formula:

Area index $z=Ml_z \times Fm_z \times Bn_z$

The area affecting coefficient $l_z$ of the memory size is "1" when the memory size is, for example, 1 kByte. In other words, when the memory size is 10 kBytes, the area affecting coefficient $l_z$ of the memory size is "10". The area affecting coefficient $m_z$ of the FIFO quantity is "1" when the FIFO quantity is 128 bytes. In other words, when the FIFO quantity is 256 bytes, the area affecting coefficient $m_z$ of the FIFO quantity is "2". The area affecting coefficient $n_z$ of the bus width is "1" when the bus width is 16 bits. In other words, when the bus width is 8 bits, the area affecting coefficient $n_z$ of the bus width is "0.5".

Then, as is shown in FIG. 11(d), with respect to the performance index x, the power index y and the area index z calculated as described above, affecting coefficients (weighting coefficients) a, b and c are respectively determined, and the resultants are summed up to obtain an optimal index. Specifically, the optimal index Op is calculated by the following formula:

Optimal index $Op=ax+by+cz$

Then, a library having a smallest optical index Op is ultimately selected.

Synthesis of Optimal IF

Figure 12:
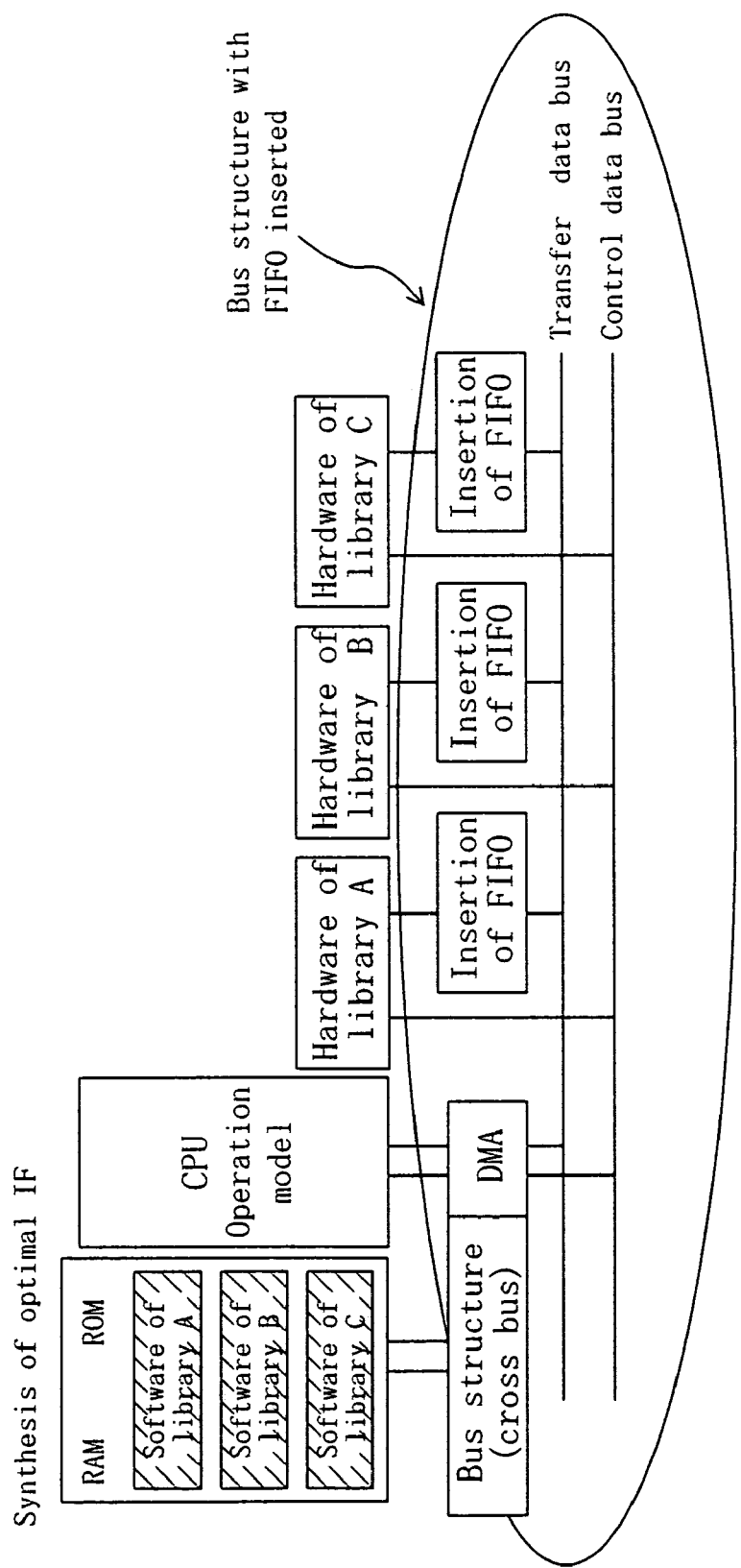
FIG. 12 is a block diagram for showing the structure of an optimal IF synthesized by a method of designing an interface of Embodiment 2.

FIG. 12 is a block diagram for showing the structure of an optimal IF synthesized through the aforementioned procedures. In a bus structure selected based on the aforementioned analysis indexes, FIFOs are inserted into necessary portions, so as to construct a bus structure capable of concurrent processing. In FIG. 12, a portion surrounded with a solid line excluding the DMA corresponds to the IF (interface). Specifically, the bus structure including a data bus, a control bus, a cross bar bus and the like and the inserted FIFOs together form the IF for connecting hardware of the libraries A, B and C, the CPU (operation model) and a storage device (such as a RAM and a ROM).

Figure 13:
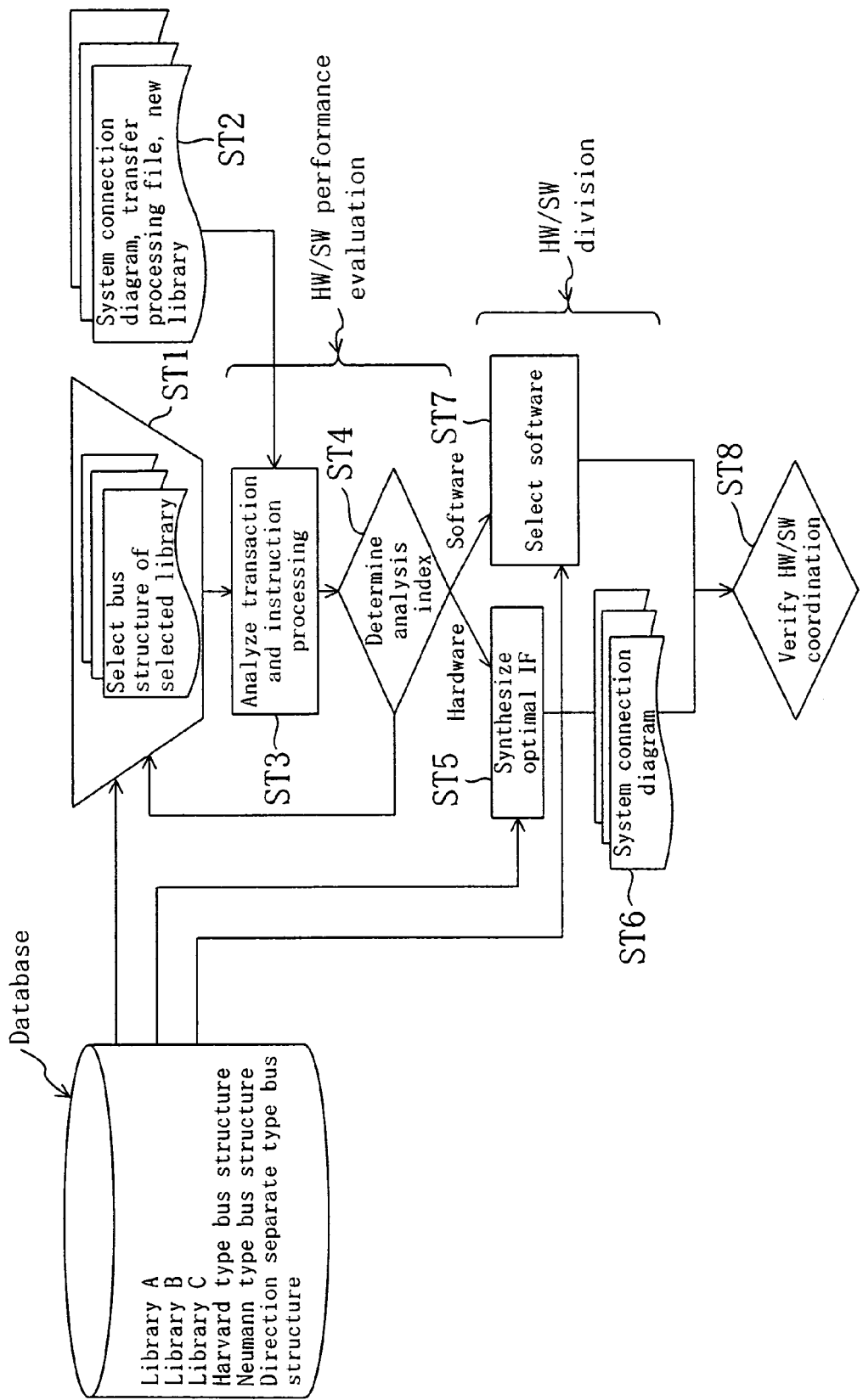
FIG. 13 is a flowchart for showing procedures in system design including the synthesis of an optimal IF according to Embodiment 2.

FIG. 13 is a flowchart for showing procedures in system design including the synthesis of an optimal IF described in this embodiment.

First, libraries A, B and C similar to those shown in FIGS. 5(a) and 5(b), and the Harvard type bus structure, the Neumann (demultiplexer type) bus structure, the direction separate type bus structure and the like are stored as the database.

Then, a bus structure is selected for a selected library in step ST1, and a system connection diagram, a transfer processing file, a new library and the like are input in step ST2.

Next, in step ST3, transaction and instruction processing are analyzed. At this point, the transaction analysis shown in FIG. 7 and the instruction processing analysis shown in FIG. 8 are carried out through the operation simulation shown in FIG. 6, so as to determine the number of stages of FIFOs to be inserted and to provide a necessary cross bar bus.

Then, in step ST4, the analysis index is determined by, for example, any of the aforementioned three methods (shown in FIGS. 10(a) through 10(d) and 11(a) through 11(d)). By repeating the procedures of steps ST1 through ST4, a system having a smallest optimal index Op is selected. In steps ST3 and ST4, performance evaluation of both hardware and software (HW/SW performance evaluation) is conducted.

Next, in steps ST5 through ST7, the optimal system is divided between hardware and software. Specifically, an optimal IF is synthesized in step ST5, and a system connection diagram as shown in FIG. 12 is generated in step ST6. On the other hand, in step ST7, software (conditions) such as an application, flow control and OS (operation system) is selected.

Ultimately, in step ST8, coordination between hardware and software is verified. Specifically, it is verified whether or not software can satisfactorily function by using hardware.

In the design method for an interface of this embodiment, operation simulation is conducted by using a library corresponding an operation model registered with respect to each bus structure and each application. On the basis of sub-parameters and main parameters obtained as a result of the operation simulation, the performance of the entire system connected through the interface can be accurately evaluated in an environment close to actual use. Then, on the basis of the evaluation, an interface most suitable to requirement of a designer can be selected, so as to construct the entire system.

What is claimed is:

1. A method of designing an interface of a semiconductor integrated circuit which executes plural applications, each of said applications relating to a specific function, by using a database storing plural libraries corresponding to operation models of said plural applications, comprising a step of:
    analyzing a number of collisions of bus transaction through operation simulation arranged on a processing time base where said applications are operated by said semiconductor integrated circuit by successively using each of said plural libraries as the operation model of each of said plural applications.

2. The method of designing an interface of claim 1, further comprising a step of generating FIFOs in a number of stages according to the number of collisions of bus transaction,
    wherein the number of collisions of bus transaction is analyzed with the FIFOs virtually inserted between said applications.

3. A method of designing an interface of a semiconductor integrated circuit which executes plural applications, each of said applications relating to a specific function, by using a database storing plural libraries corresponding to operation models of said plural applications, comprising a step of:
    analyzing a number of concurrent instruction processing through operation simulation arranged on a processing time base where said applications are operated by said semiconductor integrated circuit by successively using each of said plural libraries as the operation model of each of said plural applications.

4. The method of designing an interface of claim 3, wherein a structure of a cross bar bus is determined in accordance with the number of concurrent instruction processing.

5. The method of designing an interface of claim 4, further comprising the steps of:
    determining a portion where the number of concurrent instruction processing is larger than a predetermined value; and
    generating a DMA and/or at least one cross bar bus to be disposed in a bus where the number of concurrent instruction processing is larger than the predetermined value,
    wherein the number of concurrent instruction processing is analyzed with the DMA and/or at least one cross bar bus disposed in the bus.

6. A method of designing an interface of a semiconductor integrated circuit which executes plural applications, each of said applications relating to a specific function, by using a database storing plural libraries corresponding to operation models of said plural applications, comprising the steps of:
    (a) setting plural main parameters for ultimately evaluating said semiconductor integrated circuit and setting plural sub-parameters affecting each of said main parameters, wherein at least one of said plural sub-parameters is obtained by operation simulation arranged on a processing time base;
    (b) selecting library groups where said main parameters meet target values by evaluating each of said main parameters on the basis of said sub-parameters of each of said libraries; and
    (c) determining an interface by selecting an optimal library group by evaluating plural main parameters determined with respect to each of said selected library groups.

7. The method of designing an interface of claim 6, further comprising, before the step (a), a step of analyzing said sub-parameters of each of said libraries through operation simulation conducted by successively using each of said plural libraries as an operation model of each of said plural applications.

8. A method of designing an interface for connection between a control function part of a semiconductor integrated circuit and plural applications by using a database storing plural libraries corresponding to operation models of said plural applications and plural bus structures, comprising the steps of:
    (a) setting plural main parameters for ultimately evaluating said semiconductor integrated circuit and setting plural sub-parameters affecting each of said main parameters;
    (b) selecting library groups where said main parameters meet target values by evaluating each of said main parameters on the basis of said sub-parameters of each of said libraries; and
    (c) determining an interface by selecting an optimal library group by evaluating plural main parameters determined with respect to each of said selected library groups,
    wherein, in the step (a), three main parameters are set and three sub-parameters are set with respect to each of said three main parameters;
    in the step (b), a three-dimensional coordinate system having said three sub-parameters as coordinate axes is built for selecting a library group where an area of a triangle determined according to values of said sub-parameters is smaller than a target value; and
    in the step (c), a three-dimensional coordinate system having said three main parameters as coordinate axes is built for determining said interface based on a library group where an area of a triangle determined according to values of said main parameters obtained from said selected library groups is minimum.

9. A method of designing an interface for connection between a control function part of a semiconductor integrated circuit and plural applications by using a database storing plural libraries corresponding to operation models of said plural applications and plural bus structures comprising the steps of:

(a) setting plural main parameters for ultimately evaluating said semiconductor integrated circuit and setting plural sub-parameters affecting each of said main parameters;

(b) selecting library groups where said main parameters meet target values by evaluating each of said main parameters on the basis of said sub-parameters of each of said libraries; and (c) determining an interface by selecting an optimal library group by evaluating plural main parameters determined with respect to each of said selected library groups, said method further comprising, after the step (a) and before the step (b), a step of selecting a library group where a specific sub-parameter noticed among said plural sub-parameters meets a target value, wherein, in the step (b), a library group where main parameters excluding a specific parameter among said plural main parameters meet target values is selected, and in the step (c), a library group where said specific main parameter is minimum is selected as said optimal library group.

10. A method of designing an interface for connection between a control function part of a semiconductor integrated circuit and plural applications by using a database storing plural libraries corresponding to operation models of said plural applications and plural bus structures comprising the steps of:

(a) setting plural main parameters for ultimately evaluating said semiconductor integrated circuit and setting plural sub-parameters affecting each of said main parameters;

(b) selecting library groups where said main parameters meet target values by evaluating each of said main parameters on the basis of said sub-parameters of each of said libraries; and (c) determining an interface by selecting an optimal library group by evaluating plural main parameters determined with respect to each of said selected library groups, wherein, in the step (a), affecting coefficients of said plural sub-parameters affecting said main parameters are respectively set, in the step (b), a library group where said main parameters meet target values is selected on the basis of said affecting coefficients and values of said sub-parameters; and in the step (b), plural main parameters obtained from said selected library groups are weighted before selecting said library group where said main parameters meet the target values.

11. A method of designing an interface of a semiconductor integrated circuit which executes plural applications, each of said applications relating to a specific function, by using a database storing plural libraries corresponding to operation models of said plural applications, comprising the steps of:

(a) successively selecting each of said plural libraries as the operation model of each of said plural applications;

(b) operating said plural applications by said semiconductor integrated circuit along a processing time sequence, and analyzing performance of said interface and said applications arranged on a processing time base by using each of said libraries;

(c) repeatedly conducting the steps (a) and (b), whereby determining an interface by selecting an optimal library group on the basis of results of the analysis; and (d) synthesizing an optimal interface on the basis of said determined parameters.

12. The method of designing an interface of claim 11, wherein, in the step (b), a number of collisions of bus transaction occurring by operating said applications is analyzed with respect to each of said libraries, and in the step (d), FIFOs in a number of stages according to the number of collisions of bus transaction are inserted between said applications.

13. The method of designing an interface of claim 11, wherein, in the step (b), a number of collisions of bus transaction occurring by operating said applications is analyzed with respect to each of said libraries, and a portion where the number of concurrent instruction processing is larger than a predetermined value is determined, and in the step (d), a cross bar bus is disposed in a bus where the number of concurrent instruction processing is larger than the predetermined value.

14. A method of designing an interface of a semiconductor integrated circuit including a bus structure, said semiconductor integrated circuit executes plural applications, each of applications relates to a specific function, the method comprising the steps of:

creating plural libraries, each library contains information of one specified application of the plural applications and one specified bus structure of said semiconductor integrated circuit;

analyzing a performance of the bus structure through operation simulation arranged on a processing time base for at least one of said plural libraries, where said specified application is operated for said specified bus structure; and determining a bus structure of said semiconductor integrated circuit in view of the result of said analyzing step.

15. The method of designing an interface of claim 14, wherein said result of said analyzing step includes a number of collisions of bus transaction occurring.

16. The method of designing an interface of claim 15, wherein said determining step includes inserting FIFOs in a number of stages according to the number of collisions of bus transaction.

17. The method of designing an interface of claim 1, wherein the operation simulation is performed without any management.

18. The method of designing an interface of claim 3, wherein the operation simulation is performed without any management.

19. The method of designing an interface of claim 7, wherein the operation simulation is performed without any management.

20. The method of designing an interface of claim 11, wherein the step (b) of operating said plural applications is performed without any management.

21. The method of designing an interface of claim 15, wherein the operation simulation is performed without any management.

* * * * *